United States Patent
Cheah et al.

(10) Patent No.: US 6,869,814 B2
(45) Date of Patent: Mar. 22, 2005

(54) SILICON-BASED ULTRA-VIOLET LED

(76) Inventors: Kok Wai Cheah, Flat 8B, Block 6, Villa Concerto, 530, Sai Sha Road, Symphony Bay (HK); Wai Kwok Wong, Flat 2, 8/F., Block C, Beverly Hill, Broadwood Road, Happy Valley (HK); Hoi Lam Tam, Rm 25, 13/F, Tung Hoi Building, 760, Nathan Road, Kowloon (HK)

(*) Notice: Subject to any disclaimer, the term of this patent is extended or adjusted under 35 U.S.C. 154(b) by 0 days.

(21) Appl. No.: 10/851,254

(22) Filed: May 21, 2004

(65) Prior Publication Data

US 2004/0211973 A1 Oct. 28, 2004

Related U.S. Application Data

(62) Division of application No. 10/389,520, filed on Mar. 14, 2003, now Pat. No. 6,759,686.
(60) Provisional application No. 60/364,683, filed on Mar. 15, 2002.

(51) Int. Cl.[7] ............................................. H01L 21/00
(52) U.S. Cl. ............................. 438/22; 438/24; 438/25; 438/28; 438/29; 438/46; 438/47; 257/13; 257/79; 257/103; 257/749; 257/918
(58) Field of Search .............................. 438/22, 24, 25, 438/28, 29, 46, 47; 257/13, 79–103, 749, 918

(56) References Cited

U.S. PATENT DOCUMENTS 6,157,047 A * 12/2000 Fujita et al. .................. 257/51
6,695,664 B2 * 2/2004 Eden et al. .................... 445/24
2003/0080688 A1  5/2003 Elden et al.

* cited by examiner

*Primary Examiner*—David Nelms
*Assistant Examiner*—Andy Huynh
(74) *Attorney, Agent, or Firm*—Merchant & Gould P.C.

(57) ABSTRACT

A light emitting diode (LED), and a method for producing the same. The LED includes a substrate that may be made of silicon, a first conductive layer on one side, and a porous insulating layer on the opposite side. The insulating layer defines microcavities therein, the microcavities having sharp tips on their inner surfaces. The microcavities have gas inside. A second conductive layer is disposed over the insulating layer. When an electrical potential is applied between the conductive layers, the gas-filled microcavities act as plasma discharge lamps, emitting light. The light may be in the ultraviolet portion of the spectrum. The method includes etching a substrate to produce a porous insulating layer on one side, depositing a first conductive layer on the opposite side, and depositing a second conductive layer over the insulating layer. The microcavities in the insulating layer are then filled with gas.

40 Claims, 7 Drawing Sheets

SILICON-BASED ULTRA-VIOLET LED

This application is a divisional of application Ser. No. 10/389,520, filed Mar. 14. 2003, U.S. Pat. No. 6,759,686 which is a Non-Provisional of U.S. Provisional-Application No. 60/364,683, filed Mar. 15, 2002, which applications are incorporated herewith by reference.

BACKGROUND OF THE INVENTION

The invention relates to an apparatus and method for emitting light. The invention also relates more particularly to a silicon-based light-emitting diode for emitting light that may include wavelengths in the ultraviolet portion of the electromagnetic spectrum.

Light emitting diodes, or LEDs, are known per se. Conventional LEDs utilize the semiconducting properties of materials such as silicon.

In a conventional LED, light is generated when free electrons drop from the conduction band of a semiconducting diode into energy holes. Each such event releases energy in the form of a photon, with the wavelength of the photon depending upon the energy gap between the conduction band and the holes. As the energy gap becomes larger, the photons released likewise become more energetic. The more energy an individual photon has, the shorter its wavelength.

The principles governing the operation of conventional LEDs are well known, and are not further described herein.

However, known LEDs suffer from several limitations.

For example, the wavelengths that may be produced are limited by the magnitude of the energy gap. The shorter the wavelength of light that is to be emitted, the larger the energy gap must be. It is therefore particularly difficult to produce light with short wavelengths, in particular ultraviolet light, using known LEDs. In principle, it is possible to produce a semiconducting LED with an energy gap large enough that it emits ultraviolet light, i.e. light having a wavelength of less than about 400 nm. However, such LEDs are difficult to produce, expensive, and inefficient.

Indeed, silicon-based LEDs are extremely inefficient emitters of light in general. The best reported efficiency for a silicon-based LED of conventional design is 0.8%. That is, no more than 0.8% of the energy applied to that LED is emitted as light, the remainder typically being lost as heat.

SUMMARY OF THE INVENTION

It is the purpose of the present invention to overcome these difficulties, thereby providing an improved apparatus and method for generating light, including but not limited to ultraviolet light.

It is more particularly the purpose of the present invention to provide an LED that is suited for producing light in wavelengths that may include the ultraviolet portion of the electromagnetic spectrum, and a method for producing the same.

An embodiment of an LED in accordance with the principles of the present invention includes a substrate. A first conductive layer is disposed on a first side of the substrate.

An insulating layer is disposed on a second side of the substrate. The insulating layer defines a plurality of microcavities therein. The microcavities have small points, referred to herein as asperities, on their surfaces. In addition, the microcavities contain gas therein.

A second conductive layer is disposed over the insulating layer. The second conductive layer is transparent to radiation of the frequency that the diode emits.

When an electrical potential is applied between the first conductive layer and the second conductive layer, the microcavities in the insulating layer act as tiny gas discharge lamps.

This occurs because the high electrical resistance of the insulating layer allows strong electric fields to develop within the microcavities. As these strong electric fields develop, the sharp tips of the asperities begin to eject electrons, ionizing the gas present in the microcavities. The gas transforms into plasma, which radiates light at one or more plasma emission lines.

By controlling the physical properties of the device, i.e. the composition and pressure of the gas in the microcavities, it is possible to control the frequency of the light emitted. For example, under the proper conditions, the light is in the ultraviolet portion of the spectrum.

It is emphasized that an LED in accordance with the principles of the present invention does not rely on semiconductive properties such as electron transport.

It is furthermore emphasized that although particular embodiments of an LED in accordance with the principles of the claimed invention may produce ultraviolet light, the invention is not limited only to embodiments that produce ultraviolet light. Other embodiments may produce other wavelengths.

An LED in accordance with the principles of the present invention may be incorporated into an LED assembly.

An LED assembly in accordance with the principles of the present invention includes an LED, with an encapsulation enclosing it. The encapsulation has a window that is transparent to the wavelength of the light that is emitted by the LED. The assembly also includes first and second contact pins that are electrically connected to the first and second conductive layers. Thus, an electrical potential applied to the contact pins causes an electrical potential to be applied to the first and second conductive layers, so that the LED then emits light.

In a method for producing an LED in accordance with the principles of the present invention, a suitable substrate is provided. A first conductive layer is applied to a first side of the substrate.

The second side of the substrate is etched to form an insulating layer with microcavities therein, the microcavities having asperites.

A second conductive layer, transparent to radiation of the wavelength that the LED is to produce, is applied over the insulating layer.

The microcavities are impregnated with gas.

An LED in accordance with the principles of the present invention may be incorporated into an LED assembly.

In a method for producing an LED assembly in accordance with the principles of the present invention, an LED is provided.

The LED is encapsulated with an encapsulation. The encapsulation has a window that is transparent to radiation of the wavelength emitted by the LED.

A first contact pin is connected electrically to the first conductive layer, and a second contact pin is connected electrically to the second conductive layer.

BRIEF DESCRIPTION OF THE DRAWINGS

Like reference numbers generally indicate corresponding elements in the figures. Unless otherwise specified herein, these figures are not to scale.

DETAILED DESCRIPTION OF THE PREFERRED EMBODIMENT

Figure 1:
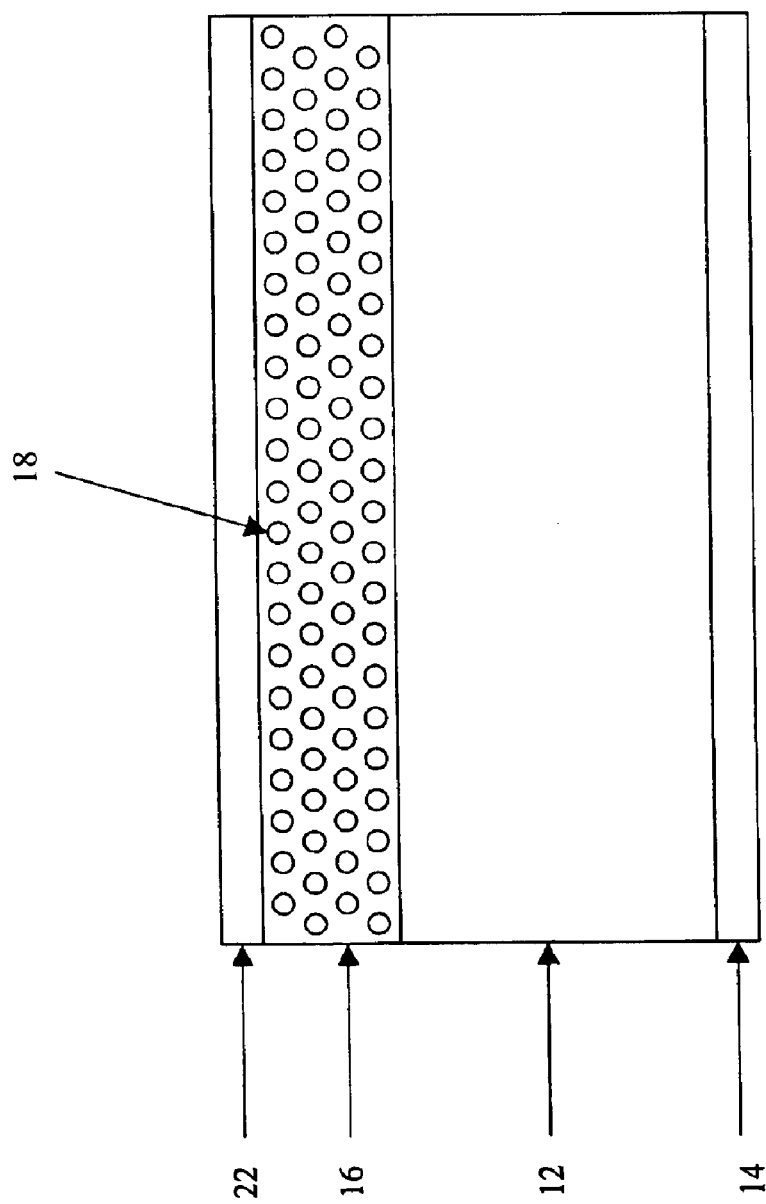
FIG. 1 shows a schematic cross-section of an embodiment of a light emitting diode in accordance with the principles of the present invention.

Referring to FIG. 1, an embodiment of an light emitting diode (LED) 10 in accordance with the principles of the present invention is shown therein.

The LED 10 includes a substrate 12.

A first electrically conductive layer 14 is disposed on a first side of the substrate 12.

An electrically insulating layer 16 is disposed on a second side of the substrate 12, opposite the first conductive layer 14. The insulating layer 16 defines a plurality of tiny cavities therein, hereinafter referred to as microcavities 18.

Figure 2:
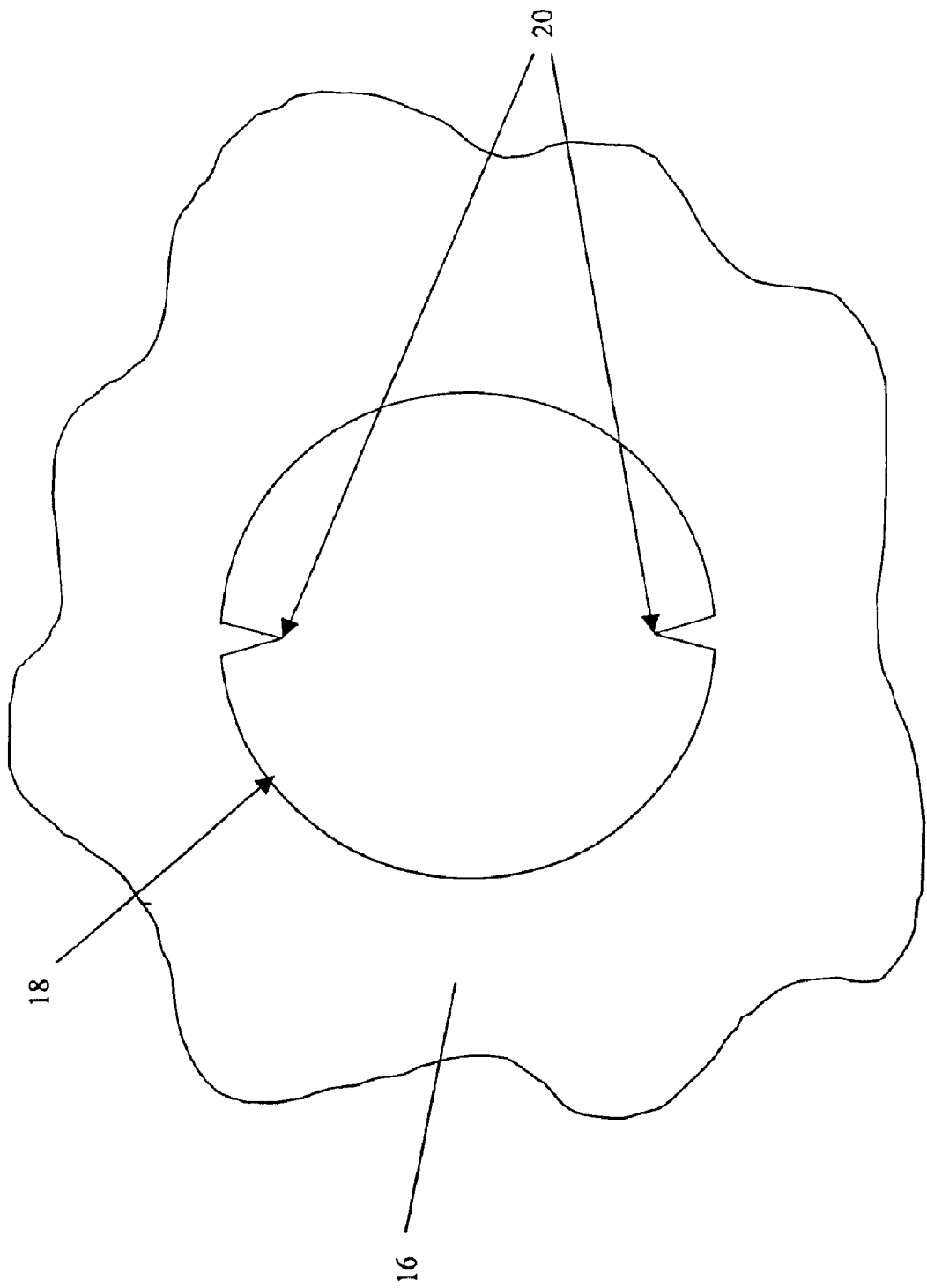
FIG. 2 shows an enlarged view of a microcavity of the LED shown in FIG. 1.

As illustrated in FIG. 2, the microcavities 18 include sharp tips therein, hereinafter referred to as asperites 20.

Returning to FIG. 1, a second electrically conductive layer 22 is disposed over the insulating layer 16.

The substrate 12 may be made from a variety of materials. In a preferred embodiment, the substrate 12 may comprise silicon. In a more preferred embodiment, the substrate 12 may comprise single-crystal silicon. In a still more preferred embodiment, the substrate 12 may comprise 100 direction type $n^+$ silicon. In a yet more preferred embodiment, the substrate 12 may be doped with antimony.

Such compositions are particularly suitable insofar as the use of silicon substrates in electronic devices is well-established and well-understood. However, the above compositions are exemplary only. A wide variety of alternative materials may be equally suitable for use as the substrate 12.

Substrates, in particular silicon substrates, are well known per se, and are not described further herein.

It is emphasized that although silicon is widely used for its semiconductive properties, the present invention does not rely on semiconduction, and does not require a substrate 12 that is semiconductive.

Rather, it is the classical resistance of the substrate 12 that is of significance to the present invention. In a preferred embodiment, the substrate 12 has an electrical resistivity of 0.008 to 0.09 Ω-cm. More preferably, the substrate 12 has an electrical resistivity of 0.008 to 0.02 Ω-cm.

The first conductive layer 14 may be made of any reasonably conductive material, including but not limited to metals and conductive polymers. In a preferred embodiment, the first conductive layer 14 comprises aluminum. However, this is exemplary only, and other conductive materials may be equally suitable.

The thickness of the first conductive layer 14 is sufficient to enable good electrical conductivity. It will be appreciated by those of skill in the art that the precise thickness of the first conductive layer 14 that is necessary depends on the material that is used for the first conductive layer 14.

For example, when the first conductive layer 14 is composed of aluminum or a material with similar electrical properties, a thickness of 0.25 to 1 µm may be sufficient for the first conductive layer 14. More preferably, the thickness may be 0.3 to 0.4 µm. However, these thicknesses are exemplary only, and different thicknesses may be equally suitable.

The insulating layer 16 comprises a material that is transparent to light of the wavelength that is to be emitted by the LED 10. However, because the insulating layer 16 is porous, with a portion of its volume being microcavities 18, it may be suitable to use materials for the insulating layer 16 that, when solid, would be poor transmitters of light.

Like the substrate 12, the insulating layer 16 may be made from a variety of materials. In a preferred embodiment, the insulating layer 16 may comprise silicon. In a more preferred embodiment, the insulating layer 16 may comprise single-crystal silicon. In a still more preferred embodiment, the insulating layer 16 may comprise 100 direction type $n^+$ silicon. In a yet more preferred embodiment, the insulating layer 16 may be doped with antimony.

However, the above compositions are exemplary only. A wide variety of alternative materials may be equally suitable for use as the insulating layer 16.

As noted with regard to the substrate 12, the present invention does not rely on semiconduction, and does not require an insulating layer 16 that is semiconductive.

In a preferred embodiment, the insulating layer 16 is formed from the same material as the substrate 12. In a more preferred embodiment, the insulating layer 16 is formed from a portion of the substrate 12.

It will be appreciated by those of skill in the art that the precise thickness of the insulating layer 16 that is necessary depends on the material that is used for the insulating layer 16.

For example, when the insulating layer 16 is composed of silicon, a thickness of 0.7 to 2.5 µm may be suitable for the insulating layer 16. More preferably, the thickness may be 1 to 2 µm. However, this thickness is exemplary only, and different thicknesses may be equally suitable.

As noted above, the insulating layer 16 is porous, and defines a plurality of microcavities 18 therein.

For clarity, the microcavities 18 are illustrated in FIG. 1 as being spherical, closed, and arranged in an orderly pattern. Although they are so illustrated for purposes of clarity, this is exemplary only.

It is not necessary for the microcavities 18 to be spherical. A variety of other shapes, including but not limited to cylinders or tubes, and amorphous "blobs", may be equally suitable. It is also noted that different microcavities 18 may have different shapes within the same insulating layer 16.

Likewise, it is not necessary for the microcavities 18 to be closed off from one another. Microcavities 18 that are interconnected may be equally suitable.

Furthermore, it is not necessary for the microcavities 18 to be distributed in a regular or orderly pattern. For certain embodiments it is preferable that the microcavities 18 are spread in a substantially uniform manner across the area of the insulating layer 16. However, a random or chaotic distribution of microcavities 18 within the insulating layer 16 may be equally suitable as an ordered arrangement.

As may be seen in FIG. 2, the microcavities 18 include asperites 20 therein. The asperites 20 are sharp tips on the surfaces of the microcavities 18.

As illustrated, the asperites 20 are discrete, conical points. However, this is exemplary only. A wide variety of shapes of asperites 20 may be equally suitable. It is only necessary that they include some relatively sharp edge or point, so as to facilitate the discharge of an electric field as described below.

Likewise, it is not necessary that each microcavity 18 contain exactly two asperites 20, or that asperites 20 be arranged at opposite ends of a microcavity 18. Although this arrangement is illustrated for clarity, it is exemplary only, and other numbers and arrangements of asperites 20 may be equally suitable.

The microcavities 18 have a gas therein. The gas is one that is suitable for producing light via a plasma discharge when an electric current flows therethrough.

A wide variety of gases are suitable for use in the present invention. Suitable gases include, but are not limited to, nitrogen, xenon, and argon. The gases need not be pure; mixtures of two or more gases may also be suitable.

A variety of pressures of gas within the microcavities 18 may be suitable. The pressure of the gas depends at least in part upon the specific physical properties of the embodiment of the LED 10 in question, i.e. the type of gas used, the size, shape, and distribution of microcavities 18 and asperites 20, the dimensions, composition, and resistivity of the insulating layer 16, etc.

For example, for certain preferred embodiments, a gas pressure of 1 to 100 mbar of nitrogen is suitable. However, this is exemplary only, and other gas pressures may be equally suitable.

Referring again to FIG. 1, the second conductive layer 22 may be made of any reasonably conductive material, including but not limited to metals and conductive polymers. In a preferred embodiment, the second conductive layer 22 comprises an alloy of gold and copper. In a more preferred embodiment, the second conductive layer 22 comprises an alloy of gold and copper in a ratio of 9:1 to 3:2. In a still more preferred embodiment, the second conductive layer 22 comprises an alloy of gold and copper in a ratio of 4:1 to 7:3. However, this is exemplary only, and other conductive materials may be equally suitable.

The thickness of the second conductive layer 22 is sufficient to enable good electrical conductivity. It will be appreciated by those of skill in the art that the precise thickness of the second conductive layer 22 that is necessary depends on the material that is used for the second conductive layer 22.

The second conductive layer 22 is transparent to light of the wavelength that is to be emitted by the LED. For certain materials, including but not limited to metals, this requirement may also help determine the suitable thickness of the second conductive layer 22.

For example, when the second conductive layer 22 is composed of an alloy of gold and copper in a ratio of 4:1 to 7:3 or a material with similar electrical and optical properties, a thickness of 20 to 100 nm may be suitable for the second conductive layer 22. More preferably, the thickness may be 30 to 60 nm. It is noted that the gold and copper alloy in question is transparent to certain wavelengths of light, including ultraviolet light, when applied in these thicknesses. However, these thicknesses are exemplary only, and different thicknesses may be equally suitable.

When an electrical potential is applied between the first and second conductive layers 14 and 22, the relatively high resistivity of the insulating layer 16 prevents the free flow of current therebetween. This results in the growth of strong electric fields within the insulating layer 16.

In particular, strong electric fields form within the microcavities 18. If the microcavities 18 were generally smooth, the electric fields might eventually stabilize. However, the sharp tips of the asperites 20 within the microcavities 18 results in local discontinuities in the electric fields. At some point, the electric fields in a given microcavity 18 collapse, whereupon the asperites 20 therein inject streams of electrons from their sharp tips into the microcavity 18.

This sudden electrical discharge ionizes the gas within the microcavity 18 into a plasma by stripping away one or more electrons from the gas atoms. When the freed electrons in the plasma recombine with the gas atoms, the gases emit radiation at characteristic wavelengths that depend upon the type of gas present in the microcavity.

For example, for nitrogen, radiation with a wavelength of approximately 337.1 nm is emitted. It is noted that this wavelength is in the ultraviolet portion of the electromagnetic spectrum. However, this is exemplary only, and embodiments of the present invention that emit other wavelengths may be equally suitable. In particular, embodiments that produce one or more wavelengths of ultraviolet radiation between 200 and 400 nm may be equally suitable. Embodiments that produce light at one or more wavelengths that are not in the ultraviolet portion of the electromagnetic spectrum may also be equally suitable.

So long as an electrical potential continues to be applied, the electric field within the microcavity 18 will regenerate after each collapse, and the process will repeat.

In other words, the microcavities 18 act as a plurality of tiny plasma discharge lamps. The operational principles of plasma discharge lamps are well known per se, and are not described further herein.

It is noted that the various microcavities 18 will not necessarily discharge in unison, nor is it necessary that they do so. Furthermore, it is not even necessary that all of the microcavities 18 that are present within a given insulating layer 16 discharge at all, so long as at least some do so.

The electric potential between the first and second conductive layers 14 and 22 is sufficient to generate electric fields that build and collapse in at least a significant portion of the microcavities 18. In a preferred embodiment, the electric potential may need be no more than approximately 20 volts. In a more preferred embodiment, the electric potential may need be no more than approximately 10 volts.

Figure 3:
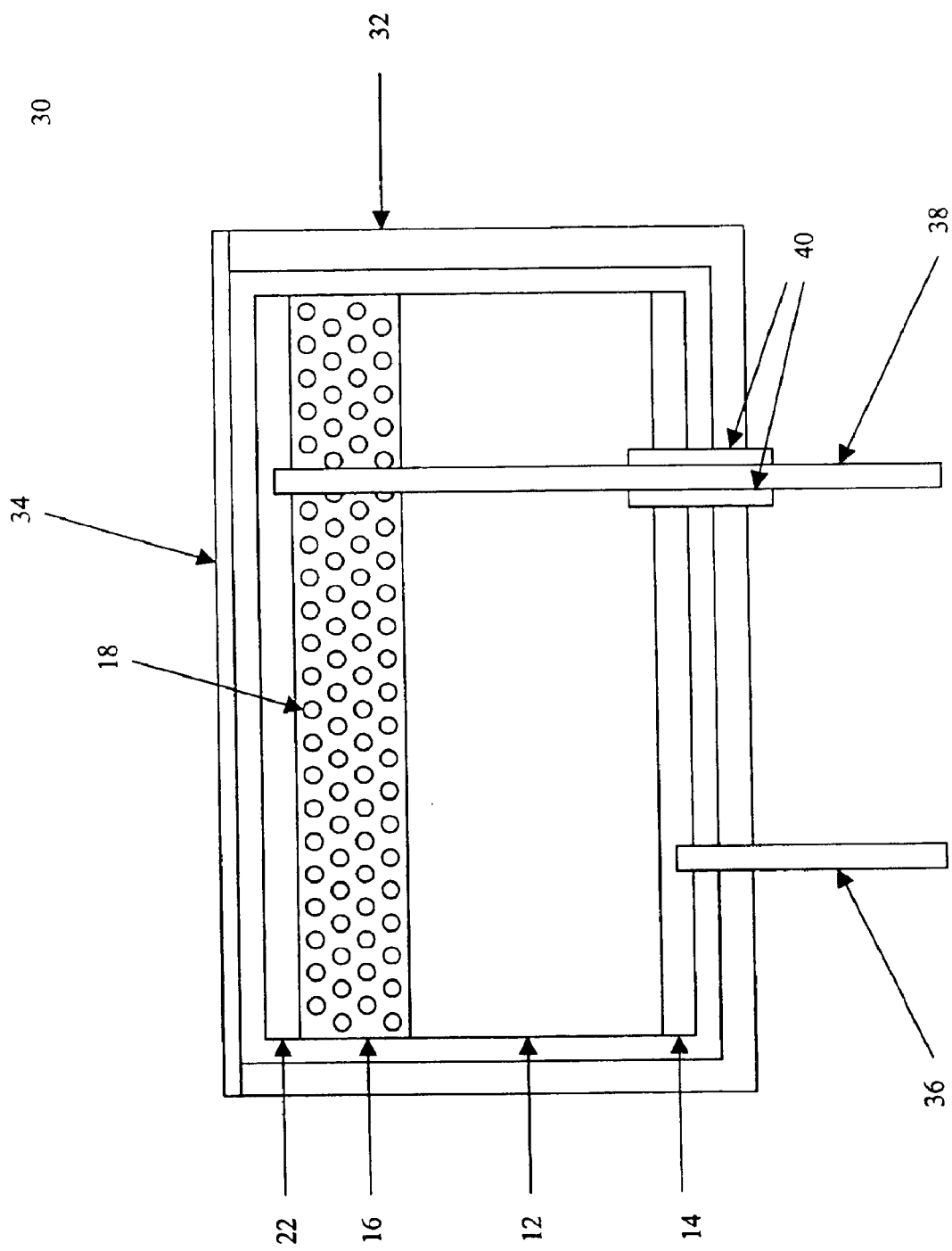
FIG. 3 shows a schematic cross-section of an embodiment of an LED assembly in accordance the principles of the present invention.

Turning to FIG. 3, an embodiment of an LED assembly 30 in accordance with the principles of the present invention is shown therein.

The LED assembly 30 includes an LED in accordance with the principles of the claimed invention, similar to the LED 10 shown in FIG. 1.

The LED assembly thus includes a substrate 12, a first electrically conductive layer 14 is disposed on a first side of the substrate 12, and an electrically insulating layer 16 is disposed on a second side of the substrate 12. The insulating layer 16 defines a plurality of microcavities 18 therein, with asperites 20. A second electrically conductive layer 22 is disposed over the insulating layer 16.

In addition, the LED assembly 30 includes an encapsulation 32, which encapsulates the substrate 12, first electrically conductive layer 14, electrically insulating layer 16, and second electrically conductive layer 22.

The encapsulation 32 includes a window 34 that is transparent to light of the wavelength that the LED emits.

The encapsulation 32 encapsulates the LED, both to protect the LED, and also to protect persons or structures that come in contact with it from damage that might be caused by electric potential, plasma emission, etc.

In addition, certain embodiments of encapsulation 32 may act as a barrier between the microcavities 18 and the outside atmosphere, in order to reduce any exchange of gas between the atmosphere and the microcavities 18 that might degrade the performance of the LED. In those embodiments, the encapsulation may be gas-tight.

The LED assembly 30 also includes a first contact pin 36 that is in electrical contact with the first conductive layer 14, and a second contact pin 38 that is in contact with the second conductive layer 22.

Thus, an electrical potential that is applied between the first and second contact pins 36 and 38 results in a similar electrical potential being applied between the first conductive layer 14 and the second conductive layer 22.

It is emphasized that incorporating the LED 10 previously shown and described into the LED assembly 30 is exemplary only. For certain applications, it may be equally suitable to incorporate an LED 10 in accordance with the principles of the present invention into other assemblies, or to use it as a stand-alone device.

A variety of materials may be suitable for use as the encapsulation 32. Suitable materials include, but are not limited to, plastics.

A variety of materials likewise may be suitable for use as the window 34. Suitable materials include, but are not limited to, glass transparent to light of the wavelength emitted by the LED.

Similarly, a variety of materials may be suitable for use as the first and second contact pins 36 and 38. In a preferred embodiment, the first and second contact pins 36 and 38 are made of metal wire. However, this is exemplary only, and other materials may be equally suitable.

It is noted that, although only two contact pins 36 and 38 are shown, it may be equally suitable for certain embodiments to include additional contact pins.

As illustrated in FIG. 3, the second contact pin 38 passes through the first conductive layer 14, the substrate 12, and the insulating layer 16 to reach the second conductive layer 22. As shown, in order to prevent short circuits (i.e. between the second contact pin 38 and the first conductive layer 14), the LED assembly 30 may include insulation 40 to isolate the second contact pin 38.

However, this is exemplary only. For certain embodiments, it may not be necessary to use insulation 40 to isolate the second contact pin 38. For example, the second contact pin 38 may be connected to the second conductive layer 22 in such a way that it does not contact the first conductive layer 14. One exemplary arrangement is to connect the second contact pin 38 directly to the second conductive layer 22 without passing through other portions of the LED. Another exemplary arrangement is to prepare an aperture in the first conductive layer 14 proximate the location of the second contact pin 38, so as to avoid contact therebetween. Other embodiments may likewise be suitable.

Figure 4:
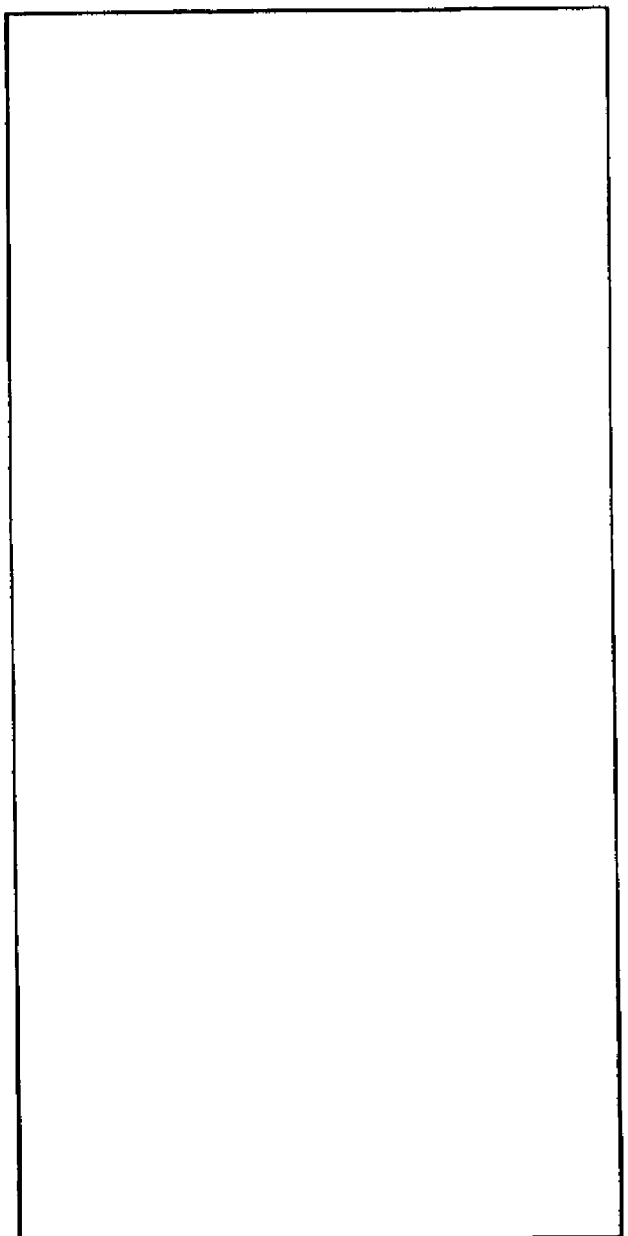
FIG. 4 shows an LED at a point in its production using a method in accordance with the principles of the present invention.
Figure 5:
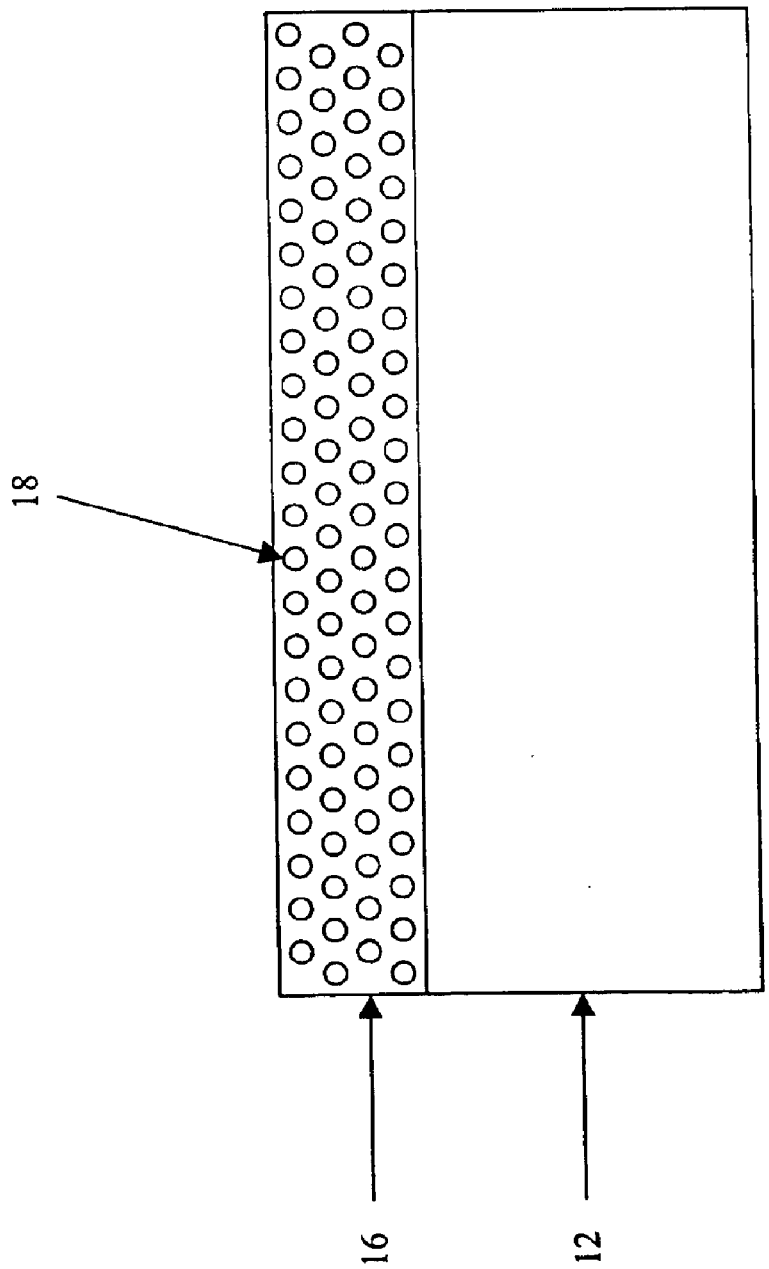
FIG. 5 shows the LED of FIG. 4 at a later point in its production.
Figure 6:
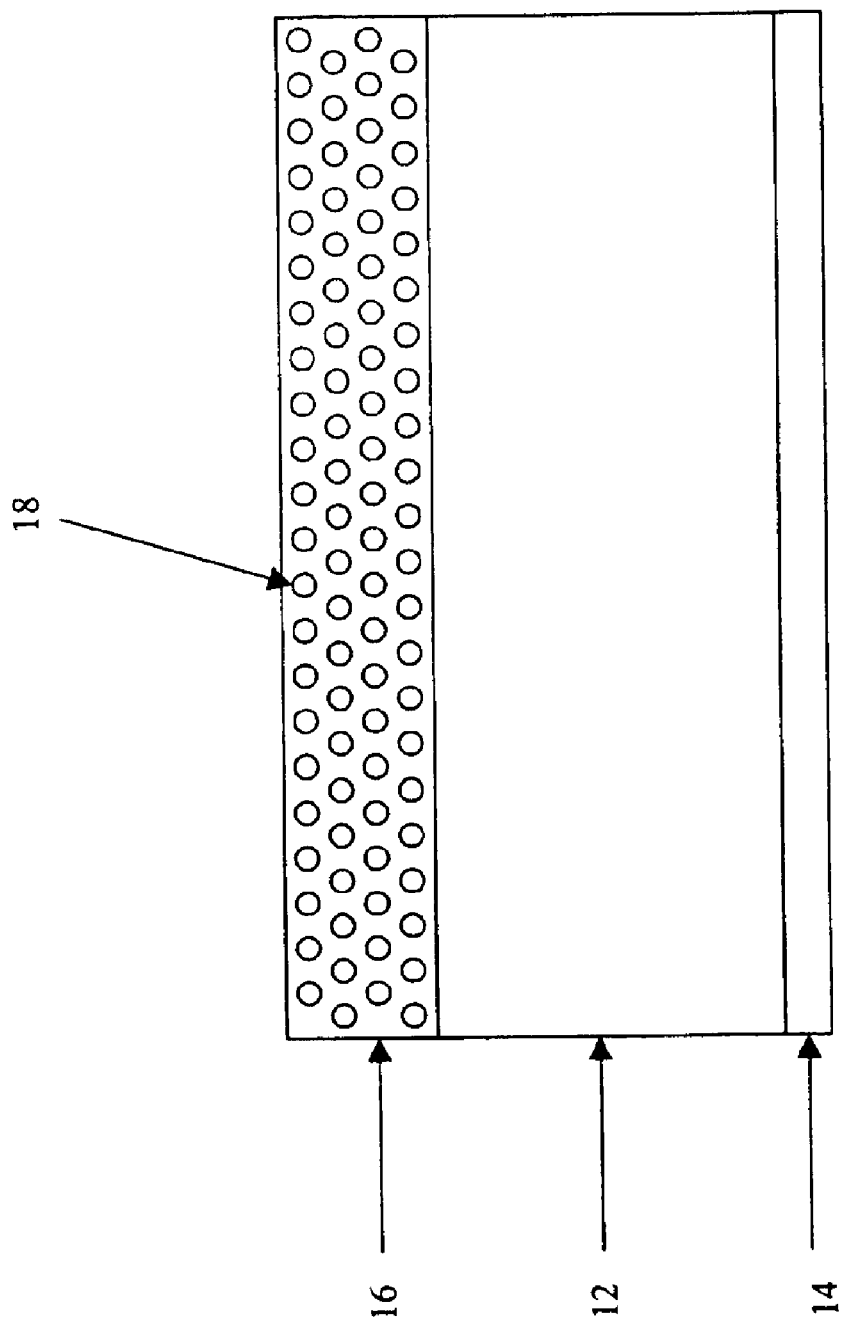
FIG. 6 shows the LED of FIG. 5 at a later point in its production.

FIGS. 4–6 show an LED similar to the LED 10 illustrated in FIG. 1, at several points in an exemplary production process.

As shown in FIG. 4, the exemplary process begins with a substrate 12. Methods for producing substrates, in particular silicon substrates, are well known per se, and are not described further herein.

As shown in FIG. 5, an insulating layer 16 is then formed on the substrate 12. The insulating layer has microcavities 18 and asperites 20 therein.

As may be seen from a comparison of FIGS. 4 and 5, in the exemplary process illustrated therein the insulating layer 16 is formed from a portion of the substrate 12. However, this is exemplary only, and other methods, including but not limited to forming an insulating layer 16 separately and applying it to the substrate 12, may be equally suitable.

One exemplary method for producing the insulating layer 16 with the microcavities 18 and the asperites 20 therein is to electrochemically etch the substrate 12, so as to render a portion of the substrate 12 porous.

Figure 7:
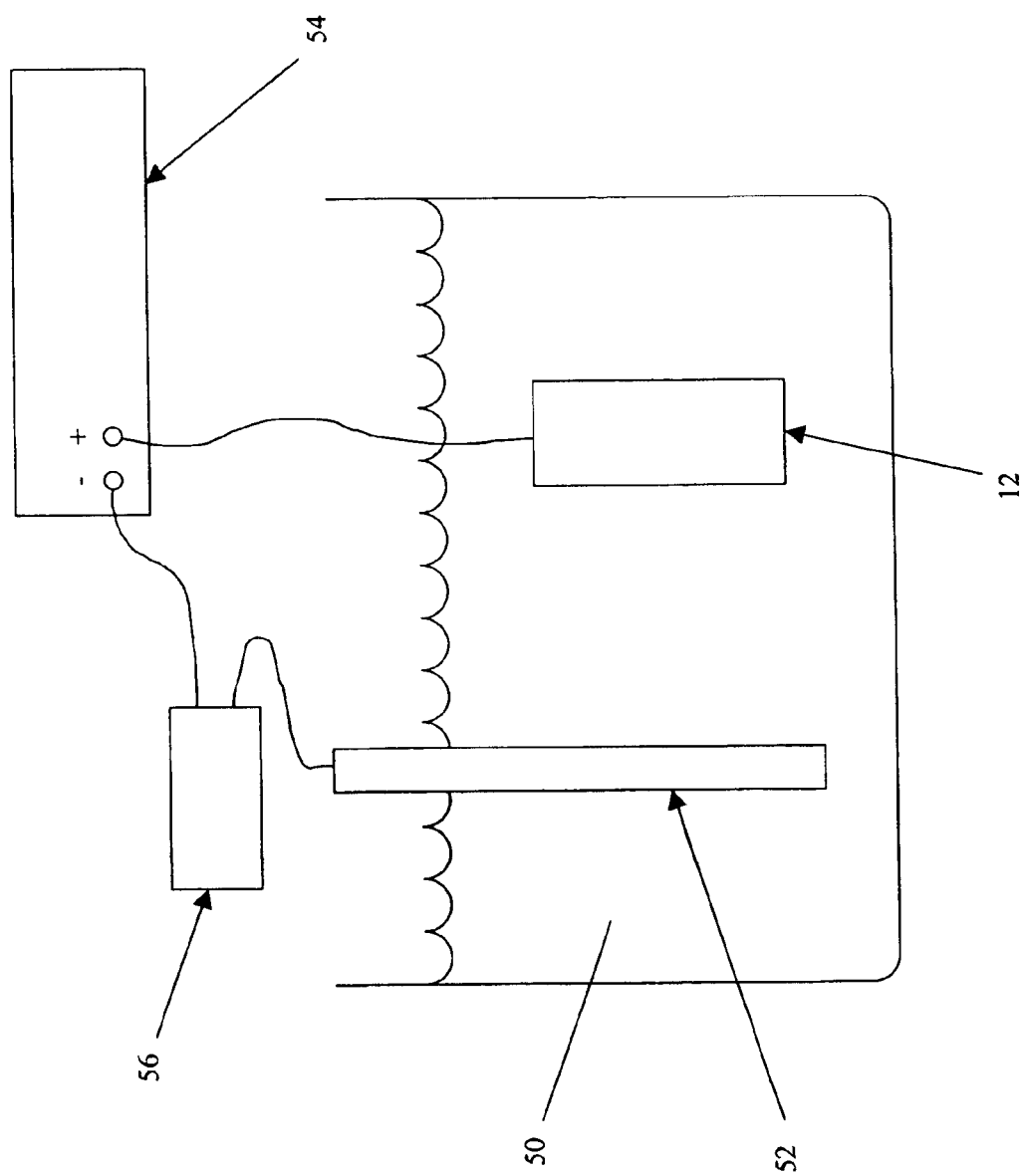
FIG. 7 shows an embodiment of an arrangement for producing an insulating layer with microcavities therein in accordance with the principles of the present invention.

Referring to FIG. 7, an exemplary arrangement for electrochemically etching the substrate 12 is shown therein.

As illustrated in FIG. 7, the substrate 14 with the first conductive layer 12 disposed therein is placed in a bath of etchant 50.

The substrate 14 is connected electrically to a power supply 54. As shown, the substrate is connected to the positive terminal of the power supply 54, and so acts as the anode.

A cathode 52 is also placed in the etchant 50, and is connected to the negative terminal of the power supply 54. In order to facilitate monitoring of the etching process, an ammeter 52 may be connected between the cathode 52 and the power supply 54. However, this is exemplary only.

The composition of the cathode depends at least in part on the etching conditions and the type of etchant 50 used. For example, a platinum cathode is suitable for many types of electrochemical etching operations, as it is highly conductive, heat tolerant, and highly resistant to corrosion. However, this is exemplary only, and other types of cathode may be equally suitable.

A variety of etchants 50 and etching conditions may be suitable for performing electrochemical etching of the substrate 12. It will be appreciated by those of skill in the art that the particular conditions and etchants 50 will vary depending on such factors as the material used to form the substrate 12.

For example, for a substrate 12 comprised of silicon, a preferred embodiment of an etching step may use an etchant 50 comprising an ethanoic hydrogen fluoride solution. In a more preferred embodiment, the etchant might have a concentration of 10% to 25%. In a still more preferred embodiment, the etchant might have a concentration of 24%.

Likewise, for a substrate 12 comprised of silicon, a preferred embodiment of an etching step may include etching with a current density of 1 to 4 $mA/cm^2$. In a more preferred embodiment, the current density may be 2 $mA/cm^2$.

Similarly, for a substrate 12 comprised of silicon, a preferred embodiment of an etching step may last for from 5 to 30 minutes. In a more preferred embodiment, etching may last for from 10 to 15 minutes.

In addition, for certain embodiments, it may be preferable to apply a resist to some or all of the substrate 12, and/or any other elements of the LED 10 that are present during etching in order to control the portions that are etched.

However, these parameters are exemplary only, and other etchants and other etching conditions may be equally suitable.

Furthermore, the use of an electrochemical etching step is itself exemplary only. Other steps for producing an insulating layer 16 with microcavities 18 and asperites 20 therein may be equally suitable.

In some embodiments of a method according to the principles of the present invention wherein the insulating layer 16 is formed by etching the substrate 12, it may be preferable to heat the substrate 12 prior to etching in order to drive off impurities within or on the surface of the substrate 12 that might interfere with etching.

For example, for certain embodiments, heating the substrate 12 to a temperature of 200 to 300° C., for a duration of 30±6 minutes may be suitable. Furthermore, for certain embodiments, heating the substrate 12 while it is in a vacuum may also be suitable.

However, heating the substrate prior to etching is exemplary only.

As shown in FIG. 6, a first conductive layer 14 is then applied to a first side of the substrate 12.

A variety of methods may be used to apply the first conductive layer 14 to the substrate 12. It will be appreciated by those of skill in the art that the methods suitable for applying the first conductive layer 14 depend at least in part on the particular materials used in the first conductive layer 14.

For example, when the first conductive layer 14 is composed of aluminum, suitable methods may include, but are not limited to, electroplating, vapor deposition, and sputtering. These methods are exemplary only, and different methods may be equally suitable.

In addition, in the exemplary method described herein, a second conductive layer 22 is formed over the insulating layer 16.

A variety of methods may be used to apply the second conductive layer 22 to the insulating layer 16. It will be appreciated by those of skill in the art that the methods suitable for applying the second conductive layer 22 depend at least in part on the particular materials used in the second conductive layer 22.

For example, when the second conductive layer 22 is composed of an alloy of gold and copper, suitable methods may include, but are not limited to, electroplating, vapor deposition, and sputtering. These methods are exemplary only, and different methods may be equally suitable.

When the second conductive layer 22 is applied, the resulting LED resembles that illustrated in FIG. 1.

According to this exemplary method, once the solid structure of the LED is complete, gas is introduced into the microcavities 18.

A variety of methods may be used to introduce gas into the microcavities 18. For example, for certain embodiments, impregnating the microcavities 18 by surrounding the LED with gas may be suitable. In a preferred embodiment, the microcavities 18 are impregnated to a pressure of 1 to 100 mbar for a duration of 30±6 minutes.

In addition, in certain embodiments of the method it may be suitable to heat the LED while impregnating the microcavities 18 with gas. In a preferred embodiment, the LED is heated to 100 to 150° C. while impregnating the microcavities 18 with gas.

However, these conditions and methods for introducing gas into the microcavities are exemplary only. Other conditions and other methods may be equally suitable.

It is noted that, although FIGS. 4–6 and the preceding text provide a description of an exemplary method of producing an LED that is in accordance with the principles of the claimed invention, this method, and in particular the order of the steps as described, is exemplary only.

For example, although the addition of the first conductive layer is described after the addition of the insulating layer, for certain embodiments it may be equally suitable to form the insulating layer after forming the first conductive layer.

Thus, the order of the steps as described is exemplary only, and other arrangements may be equally suitable.

A method of producing an LED assembly in accordance with the principles of the present invention may be used to produce an LED 30 similar to that shown in FIG. 3.

An LED having a substrate 12, a first electrically conductive layer 14, an electrically insulating layer 16 with a plurality of microcavities 18 and asperites 20 therein, and a second electrically conductive layer 22 is encapsulated in an encapsulation 32.

The encapsulation 32 includes a window 34 that is transparent to radiation of the wavelengths produced by the LED.

A variety of methods of forming the encapsulation 32 and the window 34 may be suitable.

A first contact pin 36 is connected electrically with the first conductive layer 14, and a second contact pin 38 is connected electrically with the second conductive layer 22, so that an electrical potential applied between the first and second contact pins 36 and 38 produces a similar electrical potential between the first conductive layer 14 and the second conductive layer 22.

A variety of methods of connecting the first and second contact pins 36 and 38 may be suitable. Suitable methods include, but are not limited to, the use of a conductive adhesive between a contact pin 36, 38 and its corresponding conductive layer 14, 22.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method for producing an light emitting diode, comprising the steps of:

providing a substrate;

forming an insulating layer on said substrate defining microcavities therein, said microcavities comprising asperities;

applying a first conductive layer to a side of said substrate opposite said insulating layer;

applying a second conductive layer on said insulating layer, said second conductive layer being transparent to electromagnetic radiation; and impregnating said microcavities with a gas.

2. The method according to claim 1, wherein:

said substrate comprises silicon.

3. The method according to claim 2, wherein:

said substrate is doped with antimony.

4. The method according to claim 2, wherein:

said substrate comprises silicon (100), type $n^+$.

5. The method according to claim 1, wherein:

said substrate has a resistivity of 0.008 to 0.09 $\Omega$-cm.

6. The method according to claim 1, wherein:

said substrate has a resistivity of 0.008 to 0.02 $\Omega$-cm.

7. The method according to claim 1, wherein:

said insulating layer is formed by etching said substrate.

8. The method according to claim 7, wherein:
said insulating layer is formed by electrochemical etching.
9. The method according to claim 8, wherein:
said electrochemical etching is conducted using an ethanoic hydrogen fluoride solution.
10. The method according to claim 9, wherein:
said ethanoic hydrogen fluoride solution has a concentration of 10% to 25%.
11. The method according to claim 9, wherein:
said ethanoic hydrogen fluoride solution has a concentration of 24%.
12. The method according to claim 8, wherein:
said insulating layer is formed using a current density of 1 to 4 mA/cm$^2$.
13. The method according to claim 8, wherein:
said insulating layer is formed using a current density of 2 mA/cm$^2$.
14. The method according to claim 8, wherein:
said substrate is etched for from 5 to 30 minutes.
15. The method according to claim 8, wherein:
said substrate is etched for from 10 to 15 minutes.
16. The method according to claim 8, wherein:
wherein said substrate serves as an anode during etching, and platinum is used as a cathode during etching.
17. The method according to claim 7, further comprising the step of:
before said substrate is etched, heating said substrate.
18. The method according to claim 17, wherein:
said substrate is heated in vacuum.
19. The method according to claim 17, wherein:
said substrate is heated at a temperature of 200 to 300° C.
20. The method according to claim 17, wherein:
said substrate is heated for 24 to 36 minutes.
21. The method according to claim 1, wherein:
said first conductive layer comprises metal.
22. The method according to claim 21, wherein:
said first conductive layer comprises aluminum.
23. The method according to claim 1, wherein:
said second conductive layer comprises metal.
24. The method according to claim 1, wherein:
said second conductive layer comprises an alloy of gold and copper.
25. The method according to claim 24, wherein:
said alloy has a gold:copper ratio of 9:1 to 3:2.
26. The method according to claim 25, wherein:
said alloy has a gold:copper ratio of 4:1 to 7:3.
27. The method according to claim 1, wherein:
said second conductive layer has a thickness of 20 to 100 nm.
28. The method according to claim 1, wherein:
said second conductive layer has a thickness of 30 to 60 nm.
29. The method according to claim 1, wherein:
said gas comprises at least one of the group consisting of nitrogen, xenon, and argon.
30. The method according to claim 1, wherein:
said microcavities are impregnated to a pressure of 1 to 100 mbar.
31. The method according to claim 1, wherein:
said microcavities are impregnated with said gas at a temperature of 100 to 150° C.
32. The method according to claim 1, wherein:
said microcavities are impregnated with said gas for 24 to 36 minutes.
33. The method according to claim 1, wherein:
said second conductive layer is transparent to radiation between 200 and 400 nm in wavelength.
34. A method for producing an LED assembly, comprising the steps of:
producing a light emitting diode by:
providing a substrate;
applying a first conductive layer to a first side of said substrate;
etching a second side of said substrate so as to form an insulating layer defining microcavities therein, said microcavities comprising asperities;
applying a second conductive layer on said insulating layer, said second conductive layer being transparent to electromagnetic radiation; and
impregnating said microcavities with a gas;
encapsulating said diode in an encapsulation, said encapsulation comprising a window transparent to electromagnetic radiation; and
electrically connecting a first contact pin to said first conductive layer and a second contact pin to said second conductive layer.
35. The method according to claim 34, wherein:
said encapsulation is gas-tight.
36. The method according to claim 34, wherein:
said window is transparent to radiation between 200 and 400 nm in wavelength.
37. The method according to claim 34, wherein:
said window has a transmittance of at least 90%.
38. The method according to claim 34, wherein:
said contact pins are bonded to said conductive layers with conductive adhesive.
39. The method according to claim 34, wherein:
said second conductive layer is transparent to radiation between 200 and 400 nm in wavelength.
40. A method for producing light, comprising the steps of:
providing a substrate;
applying a first conductive layer to a first side of said substrate;
etching a second side of said substrate so as to form an insulating layer defining microcavities therein, said microcavities comprising asperities;
applying a second conductive layer on said insulating layer;
impregnating said microcavities with a gas; and
applying an electrical potential between said first conductive layer and said second conductive layer such that said gas forms a plasma that emits radiation in the electromagnetic spectrum.

* * * * *